(12) United States Patent
Alcoe et al.

(10) Patent No.: US 6,455,924 B1
(45) Date of Patent: Sep. 24, 2002

(54) STRESS-RELIEVING HEATSINK STRUCTURE AND METHOD OF ATTACHMENT TO AN ELECTRONIC PACKAGE

(75) Inventors: David J. Alcoe, Vestal, NY (US); Randall J. Stutzman, Vestal, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/814,589

(22) Filed: Mar. 22, 2001

(51) Int. Cl.[7] ............................................. H01L 23/02
(52) U.S. Cl. ..................... 257/678; 257/718; 257/737; 257/778
(58) Field of Search ................................ 257/659, 718, 257/719, 737, 776, 778, 779

(56) References Cited

U.S. PATENT DOCUMENTS

| 5,589,711 A | * | 12/1996 | Sano et al. ............... 257/659 |
| 5,641,987 A | | 6/1997 | Lee |
| 5,821,624 A | * | 10/1998 | Pasch .......................... 257/776 |
| 5,973,407 A | | 10/1999 | Tzu et al. |
| 5,985,697 A | | 11/1999 | Chaney et al. |
| 6,034,430 A | | 3/2000 | Hamburgen et al. |
| 6,285,079 B1 | * | 9/2001 | Kunikiyo .................... 257/737 |

* cited by examiner

Primary Examiner—David Nelms
Assistant Examiner—Mai-Huong Tran
(74) Attorney, Agent, or Firm—Scully, Scott, Murphy & Presser; Lawrence Fraley, Esq.

(57) ABSTRACT

A stress-relieving heatsink structure and method of forming thereof for an electronic package, for instance, that including a semiconductor chip package which is mounted on a wired carrier, such as a circuitized substrate. The heatsink structure is constituted from a plurality of base structures which are joined along slits so as to impart a degree of flexibility to the electronic package inhibiting the forming of stresses tending to cause delamination of the package components.

22 Claims, 3 Drawing Sheets

STRESS-RELIEVING HEATSINK STRUCTURE AND METHOD OF ATTACHMENT TO AN ELECTRONIC PACKAGE

BACKGROUND OF THE INVENTION

1. Field of the Invention

The present invention relates to a stress-relieving heatsink structure for an electronic package, for instance, that includes a semiconductor chip which is mounted on a wired carrier, such as a circuitized substrate. Moreover, the invention is also directed to a method of attaching a stress-relieving heatsink structure to an electronic package.

The utilization of heatsink structures which are adapted to remove and dissipate heat generated by electronic packages, such as those comprising printed or wired circuit boards mounting one or more semiconductor chips is well known in the technology. Generally, heatsink configurations include either flat cap structures which are arranged above the semiconductor chip and heat conductively attached thereto; or heatsinks which are constituted of relatively thick and stiff base structures having pins or fins projecting therefrom in a direction or directions facing away from the electronic package or semiconductor chip so as to afford a good heat spreading capability while concurrently enabling the low cost manufacture thereof through the intermediary of suitable extrusion forming methods.

Ordinarily, in order to provide good thermal absorption of heat from the electronic package, the heatsink structure is adhesively attached through the interposition of a thin layer of a thermally conductive adhesive. However, depending upon the type of electronic package, thy stiffness of the base portion of the heatsink structure may prevent achievement of very high reliability of the electronic package due to a constraining effect produced by the structure thereof. The constraining effect can contribute to delamination and higher internal stresses, which can lead to eventual thermal fatigue of the electronic package components, in accelerated life testing.

Flexible electronic packages, (such as may have organic components in the form of the substrates or carriers mounting the integrated or printed circuits and forming integrated circuit boards), are more vulnerable to the constraining effect of the heatsink arrangement and can benefit by the use of a heatsink which does not create high stresses in the package and package interconnections.

In essence, heatsinks which have a high bending stiffness can contribute to high stresses during operation of the electronic package, which causes a significant amount of strain and stress to be imparted to the thermal adhesive which is employed in order to attach the heatsink to the electronic-package, whereby the relative deformation encountered among the various components causes failure in the operation thereof.

Currently employed heatsinks fail to provide for structures which are designed to adequately reduce stresses and strains generated during the operation of the electronic package as a result of generated heat, and which would tend to prevent delamination or fatigue of the electronic package components.

In particular, even present heatsink structures which are joined to each other fail to provide low stress joining arrangements in forming the combination thereof which would reduce stresses and strains to acceptable levels. These known structures do not address themselves to deriving the advantages which are obtainable by combining several heatsinks together prior to the assembly thereof with the electronic package components, which would require only a single location joining operation to be utilized during assembly, and a well controlled placement of the heatsinks relative to each other.

2. Discussion of the Prior Art

Thus, Hamburgen, et al. U.S. Pat. No. 6,034,430 discloses an integrated thermal coupling for a heat generating device wherein heatsink structures. include fins which are adapted to be interleaved to provide for enhanced heat dissipation. Although this provides an extensive degree of thermal contact between two separable heatsinks, the structure thereof is lightly complex, and fails to disclose the use of the effects of an adhesive interconnection between adjoining heatsink components, whereas contrastingly, the present invention teaches the mitigation of stress caused through the use of a heat conductive adhesive between the electronic package components and a composite heatsink arrangement.

Chaney, et al. U.S. Pat. No. 5,985,697 discloses heatsink consisting of a plate-like base member having a plurality of fins projecting therefrom, and which is adapted to dissipate heat generated by the electronic package. The structure disclosed in this patent fails to provide a multi-segmented heatsink arrangement which is adapted to reduce thermal mechanical stresses of the heatsink when coupled to the electronic package component.

Tzu, et al. U.S. Pat. No. 5,973,407 discloses a heat spreader arrangement which is integrally connected to a semiconductor package, and wherein a plurality of bumps and heatsink plate portions are adapted to disperse and dissipate heat to the exterior environment. There is no disclosure of a segmented heatsink arrangement which incorporates low-stress interconnections in order to avoid or reduce to tenable levels and the stresses and strains encountered during the generation of heat by the electronic package.

Similarly, Lee U.S. Pat. No. 5,641,987 discloses a heat spreader for semiconductor packages which includes different pad sizes adapted to conjointly dissipate heat generated by the package. However, as in the previously discussed prior art publications, there is no low-stress interconnection between various discrete heatsink segments which are combined to form an overall heatsink arrangement which would prevent delamination of the components of the electronic package caused by heat generated by the package.

Other patents for example, such as Lester U.S. Pat. No. 5,043,796 disclose multiple component heatsink structures which are interconnected in various regions so as to provide stress relief fracture paths. However, the stress-relief interconnections are merely constituted by reducing the thickness of part of the heatsink element to provide some bending ability, and does not in actuality produce a separate components which are adapted to be combined with other separate components to form a complete structure.

Similarly, Leecraft, et al. U.S. Pat. No. 4,296,455 also discloses a plurality of discrete heatsink components which do not, in actuality enable the reduction of stresses tending to delaminate the heatsink structure from the remaining portions of the electronic package to which they are fastened through the intermediary of an adhesive material, but which does not provide a unitarily connected entity.

SUMMARY OF THE INVENTION

Accordingly, pursuant to the present invention, there is provided a novel heatsink structure which incorporates a base structure incorporating stress-relieving slits forming discrete heatsink segments, whereby there is effectively reduced the constraining effect of a single large-sized heatsink with no appreciable loss in the thermal performance of the electronic package. Through the incorporation of low-stress adhesives, or possibly in some instances, snap fits, milled interlocking clearance slots, hinges or other low stress joining structures as the stress relieving slits provided intermediate various separate components of the heat sink structure or arrangement, a plurality of essentially smaller-sized separate heat sinks can be combined into one larger-sized low-stress heatsink structure which is pre-assembled and attached to the electronic package to enable the maximum heat-dissipation therefrom. Pursuant to preferred embodiments of the invention, an advantageous, choice for a low-stress adhesive material which may be used as connective material in the stress relieving slits intermediate the various separate heatsink substructures, there may be provided silicone or epoxy resin adhesives which are potentially constituted from the same type of material as the adhesive which is utilized to join the heatsink structure to the electronic package, such as the printed circuit or wiring board and the electronic component, such as the semiconductor chip or chips.

Accordingly, it is an object of the present invention to provide a novel heatsink structure for an electronic package which includes stress-relieving slits formed in the heatsink structure to form a plurality of essentially combinable discrete or separate smaller heatsink substructure, and which upon being adhesively attached to each other will provide for a stress-relieving arrangement while still maintaining good thermal conductivity in the heat dissipation from the electronic package.

Another object of the present invention is to provide a heatsink structure constituted of a plurality of combined smaller-sized heatsink devices or substructures which are joined along slitted edges through the intermediary of a low-stress adhesive or suitable engaging means, which will enable a certain degree of flexibility to be imparted to the overall heatsink structures so as to prevent delamination caused by heat-induced strains and stresses encountered during operation of the electronic component on which the heatsink is mounted, by a resultant reduction of the strains due to an enhanced flexibility and bendability of the heatsink structure.

Still another object of the present invention is to provide a method of forming the novel heatsink structure which is constituted of a plurality of joined or adhesively interconnected smaller heatsink components or substructures in a stress-relieving manner while the thermal conductivity of the electronic package is essentially maintained.

BRIEF DESCRIPTION OF THE ACCOMPANYING DRAWINGS

Reference may now be made to the following detailed description of preferred embodiments of the invention, taken in conjunction with the accompanying drawings; in which.

DETAILED DESCRIPTION OF A PREFERRED EMBODIMENT

Figure 1A:
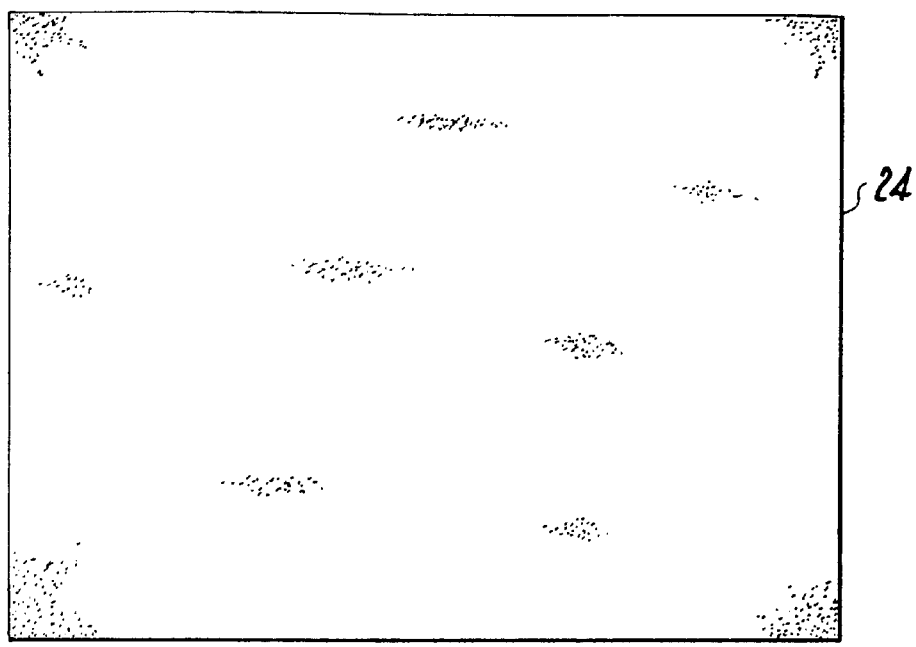
FIGS. 1a and 1b illustrate, respectively, a top plan and elevational sectional view showing, diagrammatically, a heatsink structure constructed pursuant to the prior art as bonded to an electronic package.
Figure 1B:
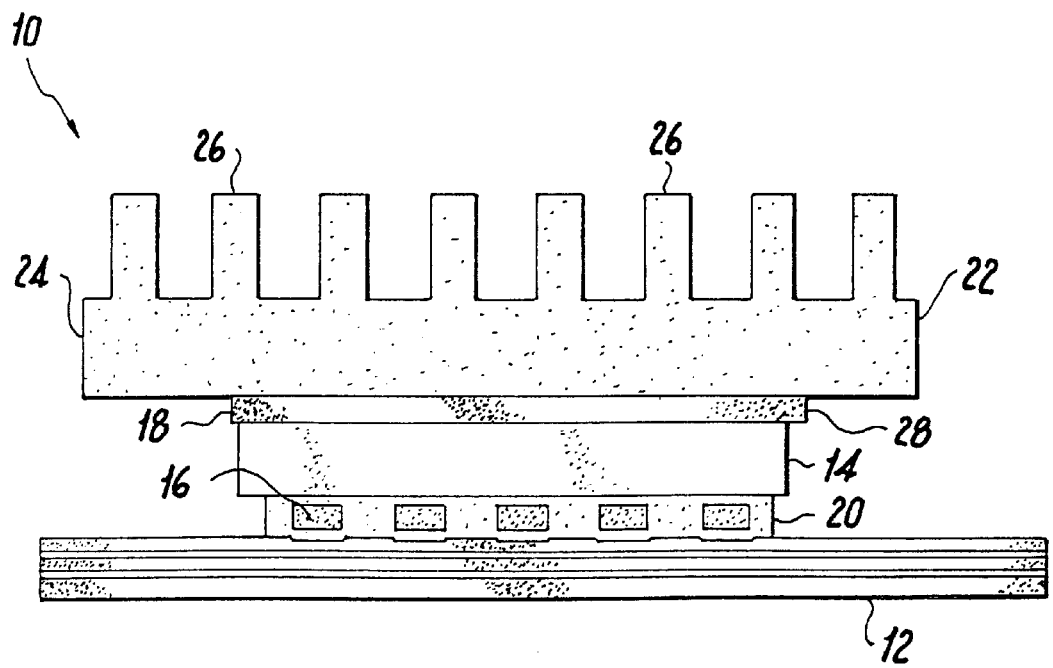

Referring now in specific detail to the drawings, and particularly FIGS. 1a and 1b, there is illustrated an electronic package which includes a heatsink in accordance with the prior art.

In particular, the electronic package 10 includes a printed or wired circuit board or card 12 which has a semiconductor chip package 14 positioned thereon, with the interposition of solder balls 16 and underfill material (not shown), as is well known in the technology.

Arranged above the semiconductor chip package 14, and facing the surface 18 thereof opposite the side 20 facing the circuit board or card 12, there is provided a heatsink structure 22 for dissipating heat generated by the electronic package 10 during operation thereof.

The heatsink structure 22, in this instance, is constituted of a relatively thick unitary base member 24 of generally flat or planar configuration, preferably constituted of a copper or aluminum material or composition, which extends in spaced relationship over and possibly beyond the peripheral confines of the semiconductor chip package 14. The heatsink structure 22 has the unitary base member 24 equipped with a plurality of upstanding spaced fins or pin members 26, which are intended to assist in further enhancing the dispersing and dissipating of heat from the electronic package 10. Interposed between the semiconductor chip package 14 and the facing surface of the heatsink base member 24 is a suitable adhesive 28, which may be of a heat conductive nature, such as a silicone or an epoxy resin adhesive, and which may be of a similar material as an adhesive (not shown) which interconnects and encapsulates the semiconductor chip package 14 with the substrate or printed circuit board 12, and the semiconductor chip package 14 with the base member 24 or heat sink structure 22.

As may be ascertained from the prior art, during heat-generating operation of the electronic package 10, and depending upon the type of electronic package, the stiffness of the base member 24 of the heatsink structure 22, due to its relatively rigid or inflexible nature, and the generally flexible or organic laminated electronic package substrates 12 which are frequently utilized in this technology, the differences in the bending properties and possibly coefficients of thermal expansion (CTE) may cause delamination and a significant loss of reliability of the electronic package due to the constraining effect caused by the rigidity of the unitarily constructed heatsink element or structure 22.

Figure 2A:
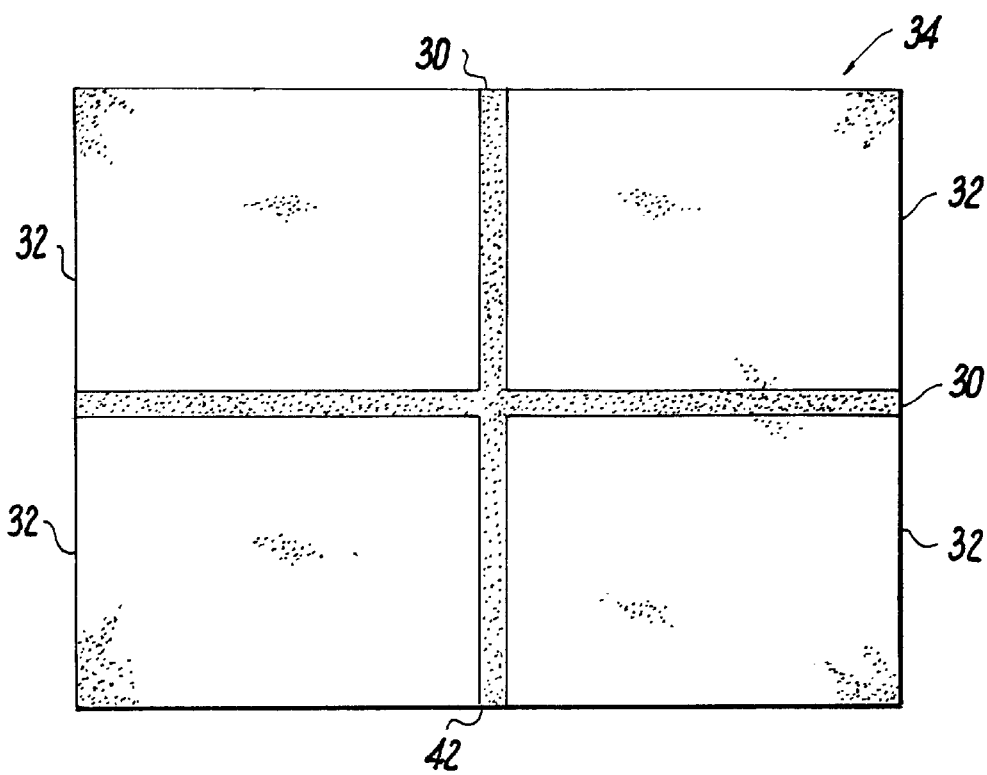
FIGS. 2a and 2b illustrate, respectively, a top plan and an elevational sectional view of a diagrammatic representation of a low stress heatsink structure bonded to an electronic package pursuant to the invention.
Figure 2B:
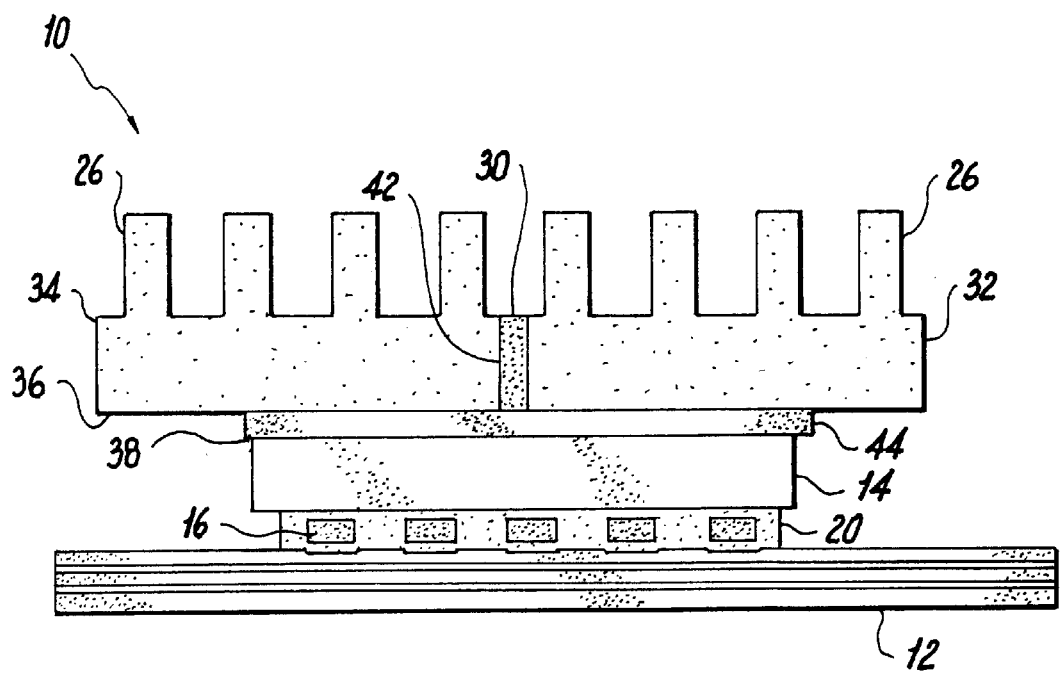

In order to ameliorate the problems encountered in the employment of a unitary or single heatsink base member 22, which is inherently of a considerable greater degree of thickness relative to the remaining components of the electronic package 10, pursuant to the present invention it has been proposed to provide stress-relieving slits in a heatsink member, having particular reference to FIGS. 2a and 2b of the drawings, wherein components which are similar to or identical with those shown in FIGS. 1a and 1b are identified by the same reference numerals.

In FIGS. 2a and 2b, as illustrated, the use of stress relieving slits or grooves 30 between adjoining heatsink base segments 32, may significantly reduce any strains on the thermal adhesive which is employed for attaching the heatsink structure 34 to the electronic package 10, in effect the adhesive which bonds the lower surface 36 of each separate of the base segments 32 of the heatsink structure 34 to the facing surface 38 of the semiconductor chip package 14.

Heretofore, grooving which has been employed in the prior art as in Lester U.S. Pat. No. 5,043,796, has to some extent relieved delamination-causing stresses. However, this has not been adequate to prevent fatiguing of the adhesive material and the resultant failure in the operation of the electronic package, or at least in reducing the reliability thereof, because bending stiffness of the heatsink base 24 was not significantly reduced as in the present invention.

In accordance with the present invention, the heat stress-relieving heatsink component is formed by means of separate heatsink base segments 32, which are separately produced and then assembled with each other prior to being positioned on and attached to the electronic package 10. In this connection, each of the base segments 32 of the heatsink structure 34 provides a portion of the generally flat base thereof, analogous to that shown in FIGS. 1a and 1b, and wherein the smaller segments 32 are initially preassembled and combined with each other with the edges in the form of the slits 30 adhesively connected to each other, preferably by means of a silicone or epoxy adhesive 42 which is heat conductive so as not to reduce the heat dissipating properties and characteristics of the entire heatsink structure 34, while concurrently providing for a stress relieving property which significantly reduces strains on the thermal adhesive 44 normally used to attach the lower stress heatsink to the electronic package. This particular type of slitted construction, and the forming of separate heatsink segments which are adhesively preassembled into the overall heatsink arrangement or structure 34, enables the utilization of a highly-filled thermally-efficient adhesive, such as a silicone or epoxy resin, for the electronic package and which generally can tolerate less strain to failure during operation.

Rather than utilizing an adhesive 42 in the slits 30 between the heatsink segments 32, it is also possible that the separate base members 32 of the heatsink structure 34 may be interconnected along the separating lines or slits 30 through the intermediary of snap fits, milled interlocking clearance slots, hinges or other low-stress joining means rather than an adhesive provided at the stress-relieving slits so as to assemble several smaller-sized heat sink elements or segments 32 into one large-sized low-stress heatsink structure 34. However, although this may of course, assist in reducing the potential for failure due to the generation of strains or stresses which would tend to delaminate the adhesive interconnecting the heatsink base 32 to the semiconductor chip package 14 or components of the electronic package 10, these alternative mechanical methods may require machining or other methods of production which may be somewhat more expensive and complicated in comparison with simply applying a good heat-conductive adhesive material 42 interconnecting the base segments 32 of the heatsink structure 34 in the slits 30 thereof.

In particular, it would be advantageous and inexpensive in connection with the production, if the adhesive material 42 which is used as a low-stress component in the stress-relieving slits 30 between the various heatsink segments 32 be constituted of an adhesive including silicones, potentially of the same type of adhesive 44 utilized to attach the heatsink base component to the electronic package 10; in effect, that used to interconnect the semiconductor chip package 14 with the facing surface of the heatsink structure 34.

Figure 3A:
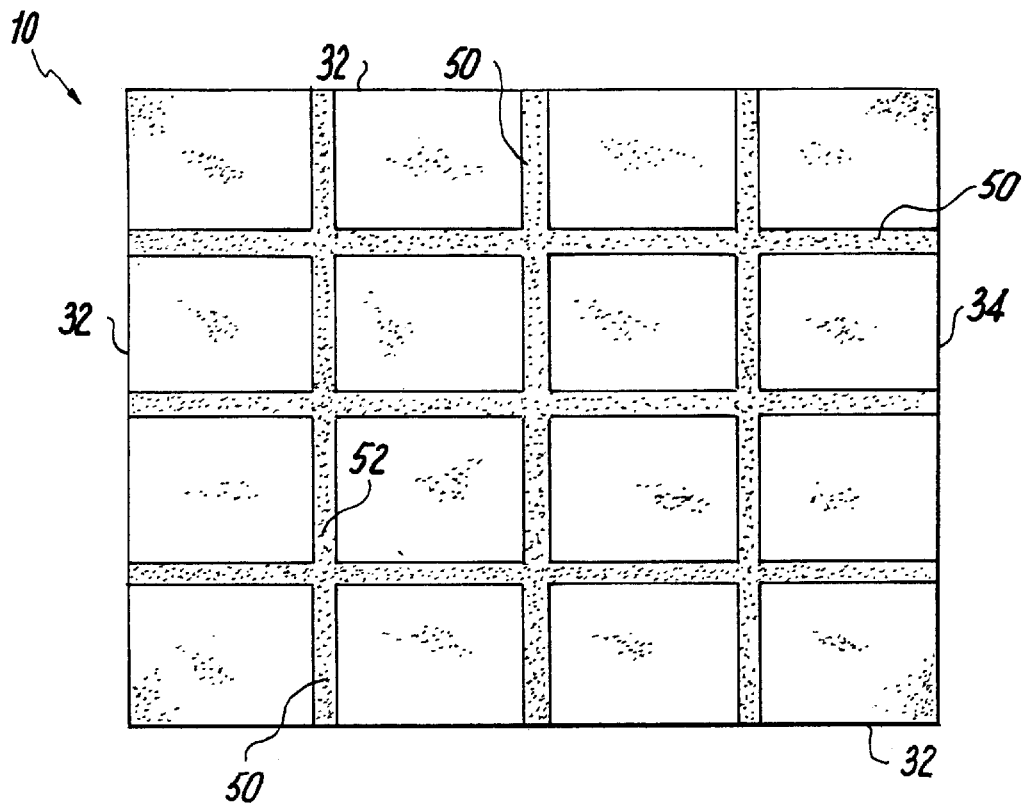
FIGS. 3a and 3b illustrate, respectively, a top plan and an elevational sectional view of a further embodiment of the inventive heatsink arrangement, showing solder-filled slits as part of a low-stress configuration attached to a lower melt solder interface with an electronic package.
Figure 3B:
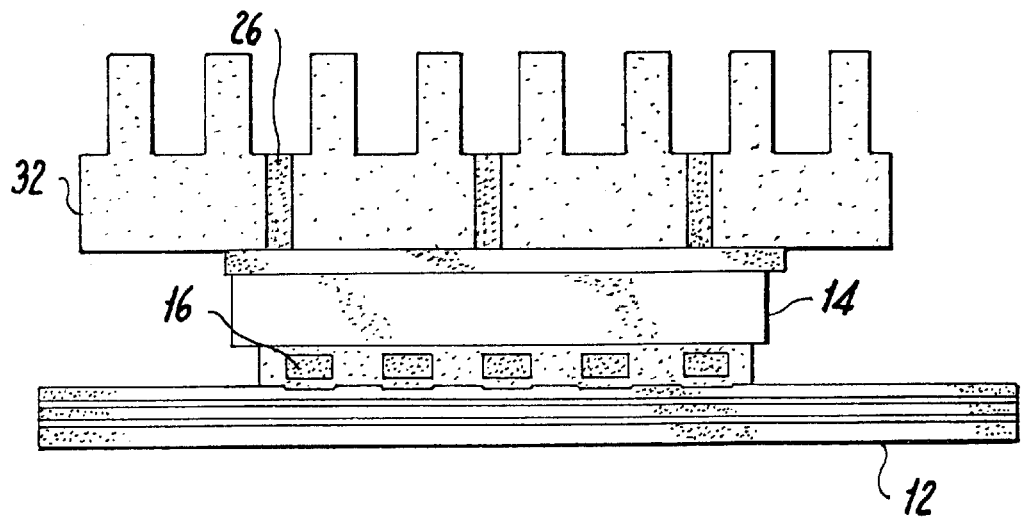

Pursuant to a further embodiment of the invention, as disclosed in FIGS. 3a and 3b of the drawings, there is disclosed the provision of solder-filled slits 50 intermediate the various base segments 32 forming the overall heatsink structure 34. In this connection, this type of construction enables the use of a solder adhesive interface for the attachment of the heatsink. Although solder is known to frequently fatigue and fracture under strain, and consequently it is critical to relieve any thermal strains imposed on a solder interface layer, the present invention provides for a construction which reduces the strain on the solder interface. Inasmuch as solder is relatively hard, in comparison with silicone adhesives, it is thus important to ameliorate the stiffness of the heatsink base structure, whereby the electronic package 10 becomes is acceptable as to its reliability and operation. This is rendered possible through the combination of the solder adhesive interface 52 in the slits 50 with stress-relieving features, such as the solder-filled slits of the heatsink components, inasmuch as the solder possesses a relatively good thermal conductivity, such that a high-thermal performance heatsink with low-stress when attached to the electronic package 10 can be readily attained. In particular, solder with hierarchial melt temperatures would provide an excellent alternative to adhesives constituted of silicone, and with the lower-melt solder being also utilized to attach the low stress heatsink base segments 32 of the structure 34 to the electronic package 10.

From the foregoing, it becomes readily apparent that by means of the slits which are formed in the heatsink arrangement, whereby a plurality of smaller heatsink elements are preassembled with each other to form a larger heatsink structure extending over the entire surface area of the semiconductor chip, and with the interposition in the slits of either a thermally conductive adhesive constituted of a silicone, or possibly a solder- type adhesive as described hereinabove, or mechanical interconnections this would readily mitigate any formation of strains and stresses during operation of the electronic package normally tending to delaminate the package components.

While the invention has been particularly shown and described with respect to preferred embodiments thereof, it will be understood by those skilled in the art that the foregoing and other changes in form and details may be made therein without departing form the spirit and scope of the invention.

What is claimed is:

1. An arrangement for dissipating heat generated by an electronic package including a circuitized substrate and at least one semiconductor chip package having a first surface positioned to face said substrate; said heat-dissipating arrangement comprising:

a heatsink structure comprising a plurality of discrete base members being arranged in mutually spaced relationship from an opposite surface of said at least one semiconductor chip package, said plurality of separate base members joined in an edge-to-edge relationship with each other so as to form a stress-relieving combination of said heatsink base members imparting an enhanced flexibility to said electronic package inhibiting delamination between said circuitized substrate and said at least one semiconductor chip package while maintaining the thermal conductivity for heat dissipation thereof; each of said base members comprising an essentially rigid rectangular base member, said plurality of base members being located in positions so as to form through-extending slits therebetween; and connecting means interposed in said slits for flexibly adhering said plurality of base members together to form said heatsink structure.

2. An arrangement for dissipating heat from an electronic package as claimed in claim 1, wherein said connecting means comprises an adhesive material.

3. An arrangement for dissipating heat from an electronic package as claimd in claim 2, wherein said adhesive material comprises a silicone adhesive.

4. An arrangement for dissipating heat from an electronic package as claimed in claim 2 wherein said adhesive material comprises an epoxy resin composition.

5. An arrangement for dissipating heat from an electronic package as claimed in claim 2, wherein said adhesive material comprises a solder adhesive having a high degree of thermal conductivity.

6. An arrangement for dissipating heat from an electronic package as claimed in claim 5, wherein said solder adhesive possesses hierarchial melt temperatures.

7. An arrangement for dissipating heat from an electronic package as claimed in claim 1, wherein said plurality of base members are joined through mechanical engaging means located in each of the slits.

8. An arrangement for dissipating heat from an electronic package as claimed in claim 7, wherein said mechanical engaging means comprises snap fits, milled interlocking clearance slots or hinge structures.

9. An arrangement for dissipating heat from an electronic package as claimed in claim 1, wherein upstanding spaced fin or pin elements are formed on each of said base members to assist in the dispersion and dissipation of heat generated by said electronic package.

10. An arrangement for dissipating heat from an electronic package as claimed in claim 1, wherein said base members are each constituted of aluminum.

11. An arrangement for dissipating heat from an electronic package as claimed in claim 1, wherein said base members are each constituted of copper.

12. A heatsink structure as claimed in claim 1, wherein each of said base members comprises an essentially rigid rectangular base member, said joining means filling said slits for adhering said plurality of base members together to form said heatsink structure.

13. A heatsink structure as claimed in claim 12, wherein said connecting means comprises an adhesive material.

14. A heatsink structure as claimed in claim 13, wherein said adhesive material comprises a silicone adhesive.

15. A heatsink structure as claimed in claim 13, wherein said adhesive material comprises an epoxy resin composition.

16. A heatsink structure as claimed in claim 13, wherein said adhesive material comprises a solder adhesive having a high degree of thermal conductivity.

17. A heatsink structure as claimed in claim 16, herein said solder adhesive possesses hierarchial melt temperatures.

18. A heatsink structure as claimed in claim 12, wherein said plurality of base members are joined through mechanical engaging means located in each of the slits.

19. A heatsink structure as claimed in claim 18, wherein said mechanical engaging means comprises snap fits, milled interlocking clearance slots or hinge structures.

20. A heatsink structure as claimed in claim 12, wherein upstanding spaced fin or pin elements are formed on each of said base members to assist in the dispersion and dissipation of heat.

21. A heatsink structure as claimed in claim 12, wherein said base members are each constituted of aluminum.

22. A heatsink structure as claimed in claim 12, wherein said base members are each constituted of copper.

\* \* \* \* \*